United States Patent
Chen et al.

(10) Patent No.: US 11,942,933 B2
(45) Date of Patent: Mar. 26, 2024

(54) VOLTAGE LEVEL SHIFTING WITH REDUCED TIMING DEGRADATION

(71) Applicant: QUALCOMM Incorporated, San Diego, CA (US)

(72) Inventors: Wilson Jianbo Chen, San Diego, CA (US); Aliasgar Presswala, Woodland Hills, CA (US); Chiew-Guan (Kelvin) Tan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 137 days.

(21) Appl. No.: 17/521,651

(22) Filed: Nov. 8, 2021

(65) Prior Publication Data
US 2023/0145180 A1 May 11, 2023

(51) Int. Cl.
*H03K 19/0185* (2006.01)
*H03K 3/037* (2006.01)
*H03K 19/003* (2006.01)

(52) U.S. Cl.
CPC ... *H03K 19/018521* (2013.01); *H03K 3/0375* (2013.01); *H03K 19/00315* (2013.01)

(58) Field of Classification Search
CPC .............. H03K 19/00315; H03K 19/018521
See application file for complete search history.

(56) References Cited

U.S. PATENT DOCUMENTS

| | | |
|---|---|---|
| 5,959,480 A | 9/1999 | Shoji |
| 6,301,322 B1 | 10/2001 | Manning |
| 7,652,937 B2 | 1/2010 | Searles et al. |
| 8,395,433 B2 | 3/2013 | Rien et al. |
| 9,625,938 B2 | 4/2017 | Thazhatheppattu et al. |
| 2010/0264975 A1* | 10/2010 | Scott ............. H03K 19/018521 327/333 |
| 2014/0218070 A1* | 8/2014 | Viani ............. H03K 19/018521 326/80 |
| 2014/0300386 A1 | 10/2014 | Jain et al. |
| 2015/0078501 A1 | 3/2015 | Olejarz et al. |
| 2018/0278252 A1 | 9/2018 | Wu et al. |
| 2021/0288648 A1 | 9/2021 | Hanagami et al. |

OTHER PUBLICATIONS

Partial International Search Report—PCT/US2022/046103—ISA/EPO—dated Jan. 27, 2023.

(Continued)

*Primary Examiner* — Patrick O Neill
(74) *Attorney, Agent, or Firm* — Loza & Loza, LLP

(57) ABSTRACT

An aspect of the disclosure relates to an apparatus including a first field effect transistor (FET) including a first gate configured to receive a first input signal that varies in accordance with a first voltage domain; and a first inverter including a first input configured to receive a second input signal that varies in accordance with a second voltage domain, and a first output configured to generate a first output signal that varies in accordance with the second voltage domain, wherein the first output signal is based on the first and second input signals, and wherein the first FET and the first inverter are coupled in series between first and second voltage rails. Per another aspect, the apparatus includes additional circuitry to allow the apparatus to process signals in accordance with a third voltage domain.

10 Claims, 5 Drawing Sheets

(56) References Cited

OTHER PUBLICATIONS

Baatar N., et al., "A Dual-rail Voltage Supply for Battery Powered Portable Devices", Circuits and Systems (APCCAS), 2010 IEEE Asia Pacific Conference on, IEEE, Dec. 6, 2010, pp. 492-495, XP031875874, DOI: 10.1109/APCCAS.2010.5774938, ISBN: 978-1-4244-7454-7, Abstract, Figures 2,3.
International Search Report and Written Opinion—PCT/US2022/046103—ISA/EPO—dated Mar. 3, 2023.

* cited by examiner

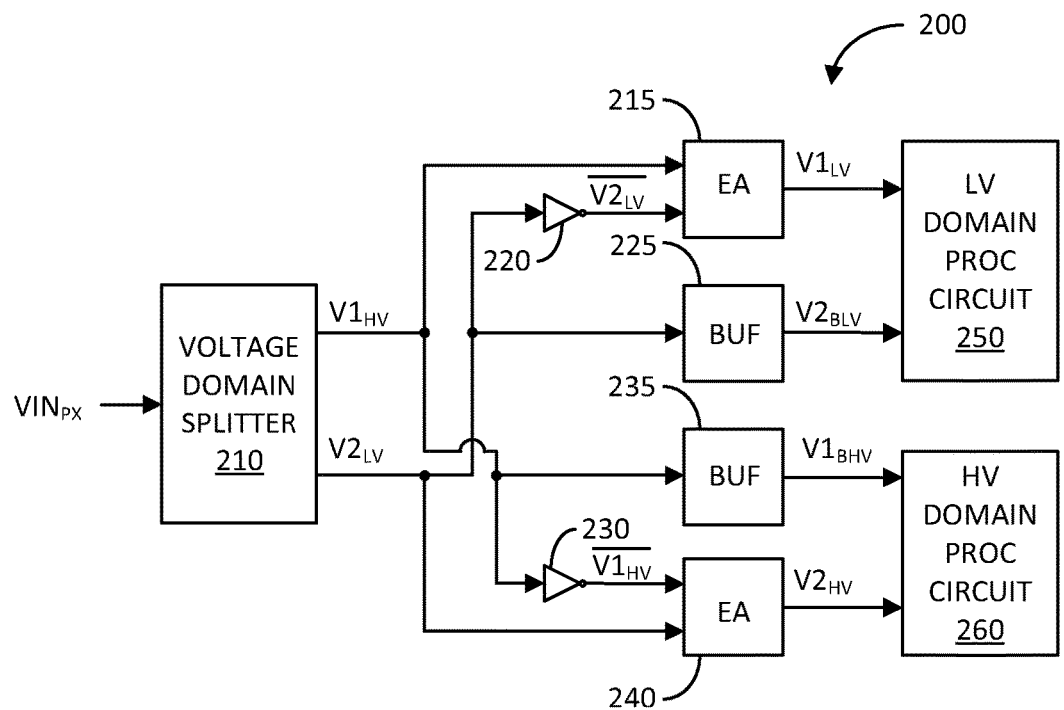
FIG. 2
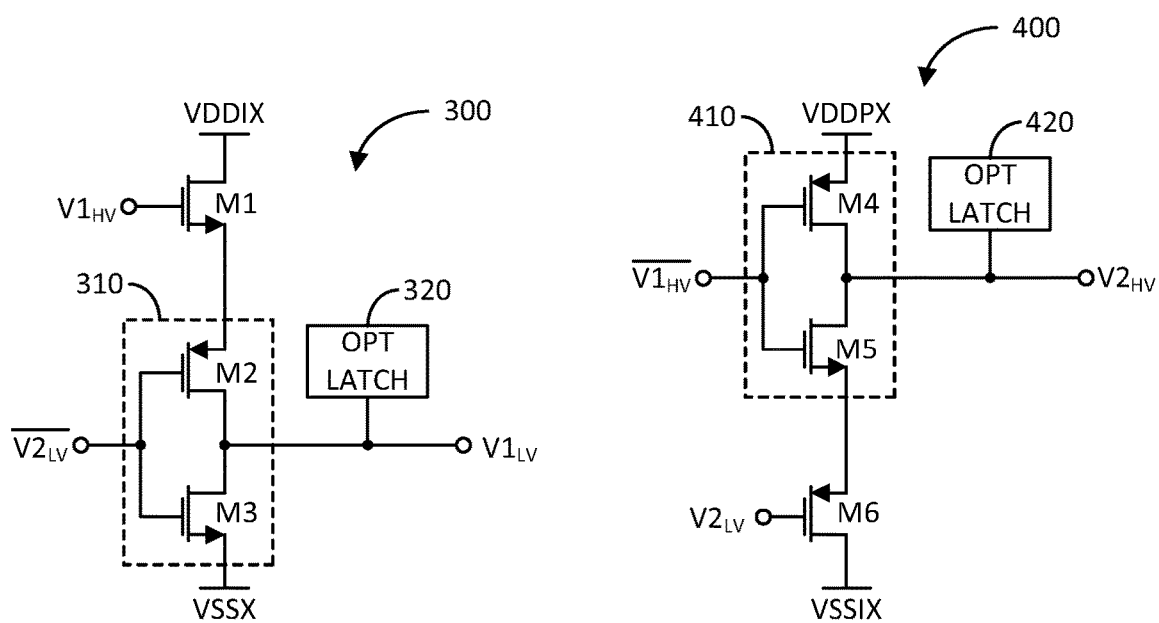
FIG. 3
FIG. 4

VOLTAGE LEVEL SHIFTING WITH REDUCED TIMING DEGRADATION

FIELD

Aspects of the present disclosure relate generally to voltage level shifters, and in particular, to a voltage level shifter with substantially no or reduced timing degradation.

BACKGROUND

A voltage level shifter is typically employed to convert an input signal in a first voltage domain to generate an output signal in a second voltage domain. A voltage domain is defined by the voltage levels of the high and low logic states of the signal. The voltage level shifter may have received the input signal from circuitry configured to process signals in the first voltage domain. The voltage level shifter may provide the output signal to circuitry configured to process signals in the second voltage domain. The voltage level shifting may be upwards where the second voltage domain has at least one logic voltage level higher than at least one corresponding logic voltage level of the first voltage domain. The voltage level shifting may be downwards where the second voltage domain has at least one logic voltage level lower than at least one corresponding logic voltage level of the first voltage domain.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first field effect transistor (FET) including a first gate configured to receive a first input signal that varies in accordance with a first voltage domain; and a first inverter including a first input configured to receive a second input signal that varies in accordance with a second voltage domain, and a first output configured to generate a first output signal that varies in accordance with the second voltage domain, wherein the first output signal is based on the first and second input signals, and wherein the first FET and the first inverter are coupled in series between first and second voltage rails.

Another aspect of the disclosure relates to a method. The method includes receiving, at a first input, a first input signal that varies in accordance with a first voltage domain in accordance with a first mode of operation; receiving, at a second input, a second input signal that varies in accordance with a second voltage domain in accordance with the first mode of operation, wherein the first voltage domain is different than the second voltage domain; and generating, at an output, a first output signal that varies in accordance with the second voltage domain in accordance with the first mode of operation, wherein the first output signal is based on the first and second input signals.

Another aspect of the disclosure relates to an apparatus. The apparatus includes a voltage domain splitter including an input configured to receive a first signal in a first voltage domain, a first output configured to generate a second signal in a second voltage domain, and a second output configured to generate a third signal in a third voltage domain, wherein the second and third signals are based on the first signal; a first edge alignment circuit configured to generate a fourth signal in the third voltage domain based on the second signal and a complementary of the third signal; and a second edge alignment circuit configured to generate a fifth signal in the third voltage domain based on a complementary of the second signal and the third signal.

Another aspect of the disclosure relates to an apparatus. The apparatus includes a voltage level shifter including an input configured to receive a first signal in a first voltage domain, a first output configured to generate a second signal in a second voltage domain, and a second output configured to generate a third signal in a third voltage domain, wherein the second and third signals are based on the first signal; a first edge alignment circuit configured to generate a fourth signal in the third voltage domain based on the second signal and a complementary of the third signal; and a second edge alignment circuit configured to generate a fifth signal in the third voltage domain based on a complementary of the second signal and the third signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 2 illustrates a block diagram of another example signal processing system in accordance with another aspect of the disclosure.

FIG. 3 illustrates a schematic diagram of an example edge alignment circuit in accordance with another aspect of the disclosure.

FIG. 4 illustrates a schematic diagram of another example edge alignment circuit in accordance with another aspect of the disclosure.

DETAILED DESCRIPTION

Figure 1A:
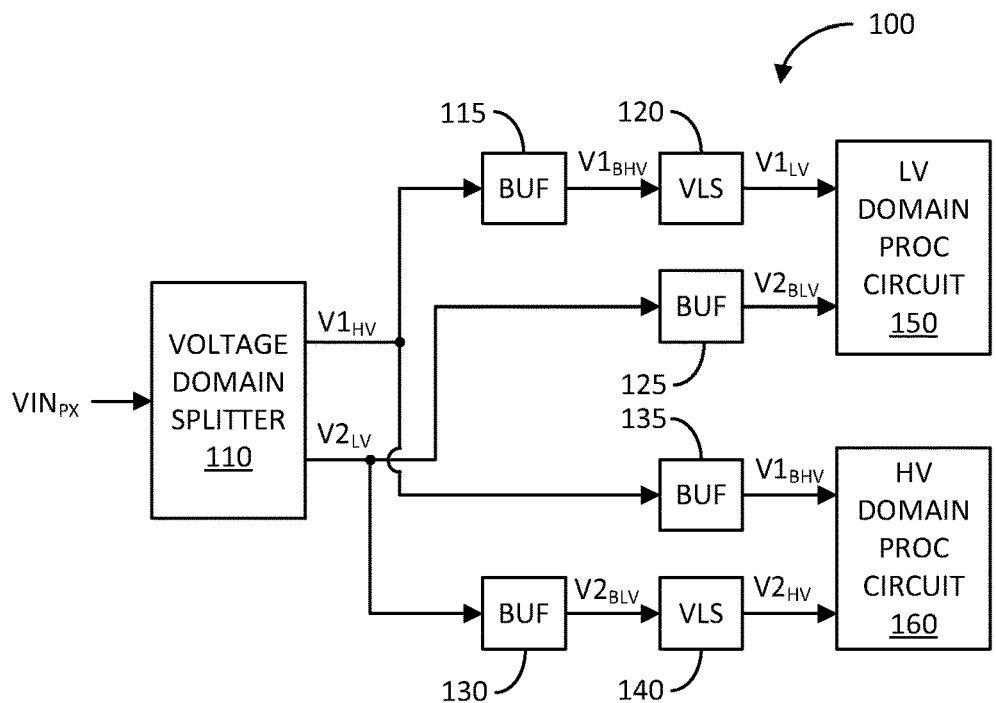
FIG. 1A illustrates a block diagram of an example signal processing system in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Voltage level shifting is used in many applications. Voltage level shifting entails shifting an input signal that varies in accordance with a first voltage domain, to generate an output signal that varies in accordance with a second voltage domain; the first voltage domain being different from the second voltage domain. A voltage domain is defined by the voltage levels of the high and low logic states of a signal. Voltage level shifting may be upwards, where the second voltage domain of the output signal has at least one logic voltage higher than at least one corresponding logic voltage of the first voltage domain of the input signal. Voltage level shifting may also be downwards, where the second voltage domain of the output signal has at least one logic voltage lower than at least one corresponding logic voltage of the first voltage domain of the input signal.

As an example of an upwards voltage level shifting, the first voltage domain of the input signal may vary between a low logic voltage of zero (0) Volt (V) and a high logic voltage of 0.9V, and the second voltage domain of the output signal may vary between a low logic voltage of 0V and a high logic voltage of 1.8V. Thus, the high logic voltage 1.8V of the second voltage domain is higher than the high logic voltage 0.9V of the first voltage domain. This example may be the case where the input signal is processed by high-speed digital circuits pertaining to an integrated circuit (IC) or a system on chip (SOC), where the high speed nature of the signal processing favors using relatively small transistors or field effect transistors (FETs) in the digital circuits. Because of the small nature of the transistors, the transistors may have a reliability limit as to the voltage that may be applied across the transistors. With regard to this example, the high logic voltage of 0.9V of the first voltage domain may be within the reliability limit of the transistors, but the high logic voltage of the second voltage domain may be outside of the reliability limit of the transistors. The second voltage domain of the output signal may be more appropriate for transmission of signals outside of the IC or SOC, such as via transmission lines of a printed circuit board (PCB).

Continuing the previous example, pursuant to a downward voltage level shifting, the second voltage domain of the input signal in this case may vary between a low logic voltage of 0V and a high logic voltage of 1.8V, and the first voltage domain of the output signal may vary between a low logic voltage of 0V and a high logic voltage of 0.9V. Thus, the high logic voltage 0.9V of the second voltage domain is lower than the high logic voltage 1.8V of the first voltage domain. This example may be the case where the input signal is received by an IC or SOC from a transmission line of a PCB, and the down voltage conversion is performed so that the high-speed digital circuits may process the output signal in the lower voltage domain so that the reliability of the transistors is not compromised. Voltage level shifters that perform the aforementioned upwards and downwards voltage level shifting may be employed by input/output (I/O) circuits or drivers of an IC or SOC to send and receive signals to and from outside of the IC or SOC. More discussion and examples of voltage level shifting is provided further herein.

FIG. 1A illustrates a block diagram of an example signal processing system 100 in accordance with an aspect of the disclosure. The signal processing system 100 is configured to receive an input signal $VIN_{PX}$ in a first voltage domain, which may be referred to herein as the "PX" voltage domain. Pursuant to the PX voltage domain, the input signal $VIN_{PX}$ may vary between a low logic voltage VSSX (e.g., 0V) and a high logic voltage VDDPX (e.g., 1.8V). As discussed further herein, the signal processing system 100 is configured to generate signals in different voltage domains for processing based on the input signal $VIN_{PX}$.

In particular, the signal processing system 100 includes a voltage domain splitter 110, buffers 115, 125, 130, and 135, and voltage level shifters 120 and 140. Additionally, the signal processing system 100 includes a low voltage (LV) domain signal processing circuit 150 and a high voltage (HV) domain processing circuit 160.

The voltage domain splitter 110 is configured to receive the input signal $VIN_{PX}$, and generate first and second signals $V1_{HV}$ and $V2_{LV}$ based on the input signal $VIN_{PX}$. Per the example previously discussed, the input signal $VIN_{PX}$ may be in the higher PX voltage domain because the signal processing system 100 may have received the signal from outside of an IC or SOC via a transmission line of a PCB. The voltage domain splitter 110 may be part of an I/O circuit or driver of an IC or SOC, and may include transistors (e.g., FETs) or circuitry (e.g., stacking of FETs) configured to reliably process signals in the PX voltage domain (e.g., 0V to 1.8V).

The first signal $V1_{HV}$ may be in the HV voltage domain, where the first signal $V1_{HV}$ varies between a low logic voltage VSSIX (e.g., 0.9V) and the high logic voltage VDDPX (e.g., 1.8V). Similarly, the second signal $V2_{LV}$ may be in the LV voltage domain, where the second signal $V2_{LV}$ varies between the low logic voltage VSSX (e.g., 0V) and a high logic voltage VDDIX (e.g., 0.9V). Thus, the voltage domain splitter 110 effectively splits the voltage domain PX (e.g., 0V to 1.8V) of the input signal $VIN_{PX}$ into an upper half voltage domain HV (e.g., 0.9V to 1.8V) and a lower half voltage domain LV (e.g., 0V to 0.9V).

Note that, in this example, the low logic voltage of the HV voltage domain is substantially the same as the high logic voltage of the LV voltage domain. Since the voltage difference (e.g., $\Delta V = 0.9V$) between the low and high logic voltages in the HV and LV voltage domains is half of the PX voltage domain, the circuits (e.g., buffers 115, 125, 130, 135, voltage level shifters 120 and 140, and signal processing circuits 150 and 160) that process these signals may be implemented using smaller transistors or FETs that may reliably process signals in the HV and LV voltage domains.

The buffer 115 is configured to buffer the first signal $V1_{HV}$ to generate a buffered first signal $V1_{BHV}$. The buffer 125 is configured to buffer the second signal $V2_{LV}$ to generate a buffered second signal $V2_{BLV}$. The buffer 135 is configured to buffer the first signal $V1_{HV}$ to generate another buffered first signal $V1_{BHV}$. The buffer 130 is configured to buffer the second signal $V2_{LV}$ to generate another buffered second signal $V2_{BLV}$. The voltage level shifter 120 is configured to downward voltage level shift the buffered first signal $V1_{BHV}$ to generate a signal $V1_{LV}$ based on the first signal $V1_{HV}$, but in the LV voltage domain. Similarly, the voltage level shifter 140 is configured to upward voltage level shift the buffered second signal $V2_{BLV}$ to generate a signal $V2_{HV}$ based on the second signal $V2_{LV}$, but in the HV voltage domain. The LV domain signal processing circuit 150 is configured to process the $V1_{LV}$ and $V2_{BLV}$ signals, as these signals are in the LV voltage domain. Similarly, the HV domain signal processing circuit 160 is configured to process the $V1_{BHV}$ and $V2_{HV}$ signals, as these signals are in the HV voltage domain.

Figure 1B:
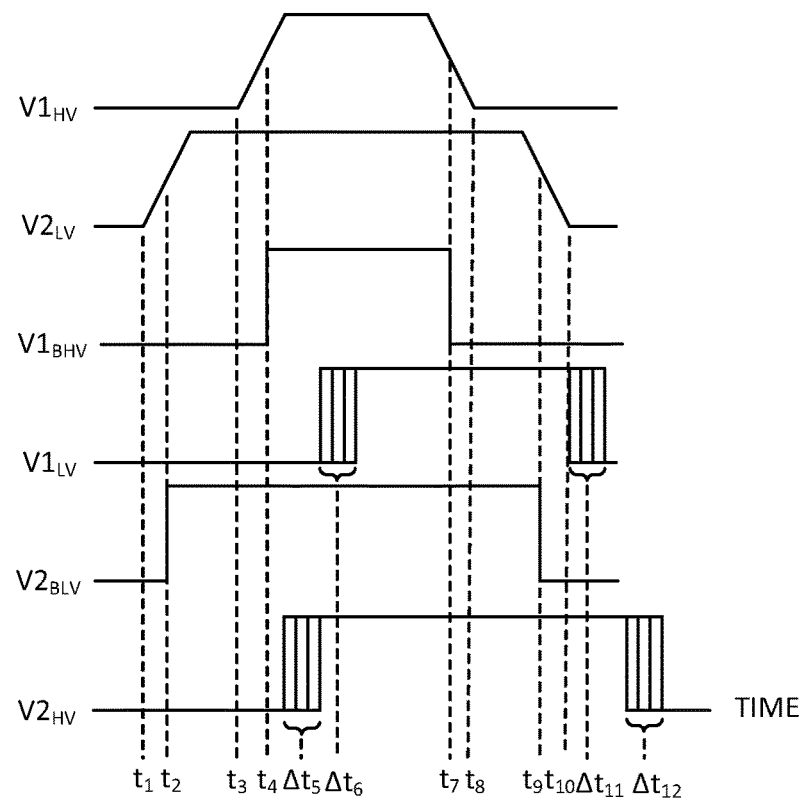
FIG. 1B illustrates a timing diagram of an example operation of the signal processing system of FIG. 1A in accordance with another aspect of the disclosure.

FIG. 1B illustrates a timing diagram of an example operation of the signal processing system 100 in accordance with another aspect of the disclosure. The horizontal axis of the timing diagram represents time. The vertical axis of the timing diagram represents logic levels, from top to bottom, of the signals $V1_{HV}$, $V2_{LV}$, $V1_{BHV}$, $V1_{LV}$, $V2_{BLV}$, and $V2_{HV}$.

As previously discussed, the first and second signals $V1_{HV}$ and $V2_{LV}$ are generated by the voltage domain splitter 110 based on the input signal $VIN_{PX}$. As both signals $V1_{HV}$ and $V2_{LV}$ are derived from the same signal $VIN_{PX}$, both signals should be logically identical, but for being in different voltage domains HV and LV. However, in some cases, the first and second signals $V1_{HV}$ and $V2_{LV}$ propagate through different data paths; and, as a result, the $V1_{HV}$ and $V2_{LV}$ are no longer identical. For instance, in the example timing diagram, the second signal $V2_{LV}$ has a pulse width or duty cycle larger than the pulse width or duty cycle of the first signal $V1_{HV}$. That is, the pulse width of the second signal $V2_{LV}$ extends from time $t_1$ to time $t_{10}$; whereas the pulse width of the first signal $V1_{HV}$ extends from time $t_3$ to time is (e.g., $t_{10}-t_1 > t_8-t_3$). As a result of this initial timing degradation, the signals derived from these signals $V1_{HV}$ and $V2_{LV}$ may experience additional timing degradation.

For instance, the first and second buffered signals $V1_{BHV}$ and $V2_{BLV}$ generated by buffers 115/135 and 130/135 based on the first and second signals $V1_{HV}$ and $V2_{LV}$ have significantly disparate pulse widths or duty cycles, respectively. For example, the second buffered signal $V2_{BLV}$ has a pulse width extending from time $t_2$ to time $t_9$, and the first buffered signal $V1_{BHV}$ has a pulse width extending from time $t_4$ to time $t_7$, where $t_9-t_2$ is significantly greater than $t_7-t_4$. This is sometimes referred to as duty cycle distortion.

Further, in accordance with this example, the voltage level shifted signals $V1_{LV}$ and $V2_{HV}$ generated by voltage level shifters 120 and 140 based on the buffered signals $V1_{BHV}$ and $V2_{BLV}$ may have further timing degradation and uncertainties, respectively. For example, in addition to duty cycle distortion, there may be timing uncertainties $\Delta T_5$ and $\Delta T_6$ in the rising edges of the voltage level shifted signals $V1_{LV}$ and $V2_{HV}$, and timing uncertainties $\Delta T_{11}$ and $\Delta T_{12}$ in the falling edges of the voltage level shifted signals $V1_{LV}$ and $V2_{HV}$, respectively. This may be because the voltage level shifters 120 and 140 typically have many devices (e.g., 18 FETs or more), and there may be significant process-voltage-temperature (PVT) operational variations due to the many devices.

Due to all of the aforementioned timing degradations, the timing of the signals $V1_{LV}/V2_{BLV}$ and $V1_{BHV}/V2_{HV}$ provided to the LV domain signal processing circuit 150 and HV domain signal processing circuit 160 may be completely destroyed, respectively. As such, the LV and HV signal processing circuits 150 and 160 may not be able to perform its intended operations based on the timing-degraded signals $V1_{LV}/V2_{BLV}$ and $V1_{BHV}/V2_{HV}$, respectively. Other drawbacks of the voltage level shifters 120 and 140 include occupying substantial IC footprint due to the many devices. Further, the delay between the input signal and the output signal of the voltage level shifters 120 and 140 could be quite large; for example, on the order of nanoseconds.

FIG. 2 illustrates a block diagram of another example signal processing system 200 in accordance with another aspect of the disclosure. The signal processing system 200 may perform the same or similar operations as that of signal processing system 100 previously discussed. However, instead of using voltage level shifters 120 and 140, the signal processing system 200 uses edge alignment circuits to reduce or substantially eliminate any timing degradation in the signals provided to LV and HV signal processing circuits.

In particular, the signal processing system 200 includes a voltage domain splitter 210, inverters 220 and 230, edge alignment circuits 215 and 240, and buffers 225 and 235. The voltage domain splitter 210 may be implemented similar as voltage domain splitter 110 previously discussed in detail. That is, the voltage domain splitter 210 is configured to receive an input signal $VIN_{PX}$ in the PX voltage domain (e.g., 0V to 1.8V), and generate first and second signals $V1_{HV}$ and $V2_{LV}$ in HV (e.g., 0.9V to 1.8V) and LV (e.g., 0V to 0.9V) voltage domains based on the input signal $VIN_{PX}$, respectively. Similarly, the buffers 235 and 225 are configured to generate buffered first and second signals $V1_{BHV}$ and $V2_{BLV}$ based on the first and second signals $V1_{HV}$ and $V2_{LV}$, respectively.

The inverters 230 and 220 are configured to invert the first and second signals $V1_{HV}$ and $V2_{LV}$ to generate complementary first and second signals $\overline{V1_{HV}}$ and $\overline{V2_{LV}}$, respectively. The edge alignment circuit 215 is configured to receive the first signal $V1_{HV}$ and the complementary second signal $\overline{V2_{LV}}$, and generate a voltage-level shifted signal $V1_{LV}$ based on these signals $V1_{HV}$ and $\overline{V2_{LV}}$. Similarly, the edge alignment circuit 240 is configured to receive the second signal $V2_{LV}$ and the complementary first signal $\overline{V1_{HV}}$, and generate a voltage-level shifted signal $V2_{HV}$ based on these signals $\overline{V1_{HV}}$ and $V2_{LV}$. As discussed further herein, the signals $V1_{LV}$ and $V2_{HV}$ generated by the edge alignment circuits 215 and 240 are substantially time aligned; preserving the timing information of the original input signal $VIN_{PX}$; and allowing the LV and HV processing circuits 250 and 260 to process them adequately pursuant to their intended operations.

FIG. 3 illustrates a schematic diagram of an example edge alignment circuit 300 in accordance with another aspect of the disclosure. The edge alignment circuit 300 may be an example detailed implementation of the edge alignment circuit 215 previously discussed.

In particular, the edge alignment circuit 300 includes a first field effect transistor (FET) M1, which may be implemented as an n-channel metal oxide semiconductor (NMOS) FET. The edge alignment circuit 300 further includes an inverter 310 including a second FET M2 and a third FET M3. The second FET M2 may be implemented as a p-channel metal oxide semiconductor (PMOS) FET, and the third FET M3 may be implemented as an NMOS FET. The FET M1 and the inverter 310 are coupled in series between an upper voltage rail VDDIX and a lower voltage rail VSSX.

The NMOS FET M1 includes a gate configured to receive the first signal $V1_{HV}$, for example, generated by the voltage domain splitter 210 based on the input signal $VIN_{PX}$. As previously discussed, the first signal $V1_{HV}$ is in the HV voltage domain (e.g., 0.9V to 1.8V). The PMOS FET M2 and the NMOS FET M3 include respective gates coupled together to form an input of the inverter 310, and configured to receive the complementary second signal $\overline{V2_{LV}}$, for example, generated by the inverter 220 based on the second signal $V2_{LV}$; which, in turn, is generated by the voltage domain splitter 210 based on the input signal $VIN_{PX}$. The complementary second signal $\overline{V2_{LV}}$ is in the LV voltage domain (e.g., 0V to 0.9V), and is substantially logically complementary to the first signal $V1_{LV}$.

The PMOS FET M2 and the NMOS FET M3 include respective drains coupled together to form an output of the inverter 310, and configured to generate the output signal $V1_{LV}$. As previously discussed, the output signal $V1_{LV}$ is in the LV voltage domain (e.g., 0V to 0.9V), and may be provided to the LV voltage domain signal processing circuit 250 as previously discussed. The edge alignment circuit 300 may optionally include a latch 320 coupled to the output of the inverter 310 to latch the output signal $V1_{LV}$. This may improve the latching of the correct logic state of the output signal $V1_{LV}$ if there is significant time delay between the first signal $V1_{HV}$ and the complementary second signal $V2_{LV}$. The upper and lower voltage rails VDDIX and VSSX are configured to receive supply voltages in accordance with the LV voltage domain (e.g., 0.9V and 0V, respectively).

FIG. 4 illustrates a schematic diagram of another example edge alignment circuit 400 in accordance with another aspect of the disclosure. The edge alignment circuit 400 may be an example detailed implementation of the edge alignment circuit 240 previously discussed.

In particular, the edge alignment circuit 400 includes an inverter 410 including a first FET M4 and a second FET M5. The first FET M4 may be implemented as a PMOS FET, and the second FET M5 may be implemented as an NMOS FET. The edge alignment circuit 400 includes a third FET M6, which may be implemented as a PMOS FET. The inverter 410 and the PMOS FET M6 are coupled in series between an upper voltage rail VDDPX and a lower voltage rail VSSIX.

The PMOS FET M6 includes a gate configured to receive the second signal $V2_{LV}$, for example, generated by the voltage domain splitter 210 based on the input signal $VIN_{PX}$. As previously discussed, the second signal $V2_{LV}$ is in the LV voltage domain (e.g., 0V to 0.9V). The PMOS FET M4 and the NMOS FET M5 include respective gates coupled together to form an input of the inverter 410, and configured to receive the complementary first signal $\overline{V1_{HV}}$, for example, generated by the inverter 230 based on the first signal $V1_{HV}$; which, in turn, is generated by the voltage domain splitter 210 based on the input signal $VIN_{PX}$. The complementary first signal $\overline{V1_{HV}}$ is in the HV voltage domain (e.g., 0.9V to 1.8V), and is substantially logically complementary to the second signal $V2_{LV}$.

The PMOS FET M4 and the NMOS FET M5 include respective drains coupled together to form an output of the inverter 410, and configured to generate the output signal $V2_{HV}$. As previously discussed, the output signal $V2_{HV}$ is in the HV voltage domain (e.g., 0.9V to 1.8V), and may be provided to the HV voltage domain signal processing circuit 260 as previously discussed. The edge alignment circuit 400 may optionally include a latch 420 coupled to the output of the inverter 410 to latch the output signal $V2_{HV}$. This may improve the latching of the correct logic state of the output signal $V2_{HV}$ if there is significant time delay between the second signal $V2_{LV}$ and the complementary first signal $\overline{V1_{HV}}$. The upper and lower voltage rails VDDPX and VSSIX are configured to receive supply voltages in accordance with the HV voltage domain (e.g., 1.8V and 0.9V, respectively).

Figure 5:
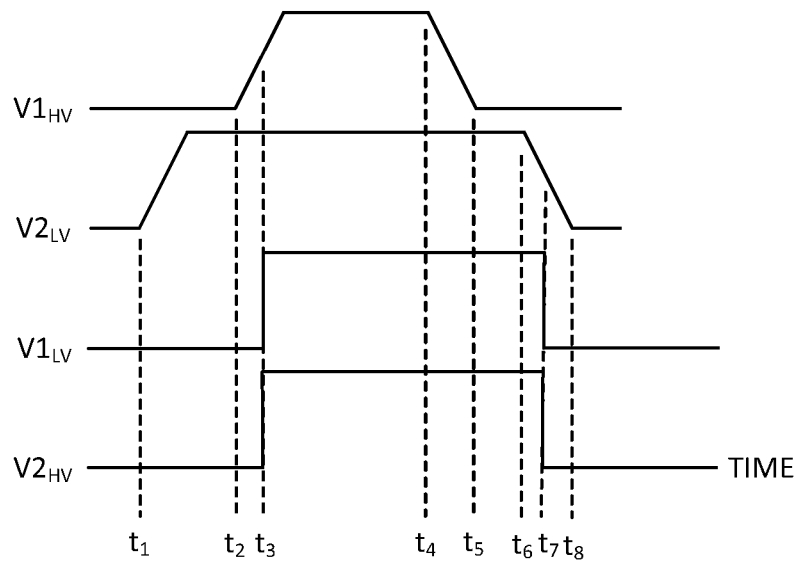
FIG. 5 illustrates a timing diagram of an example operation of the edge alignment circuits of FIGS. 3-4 in accordance with another aspect of the disclosure.

FIG. 5 illustrates a timing diagram of an example operation of the edge alignment circuits 300 and 400 in accordance with another aspect of the disclosure. The timing diagram is similar to the timing diagram of FIG. 1B, where the horizontal axis represents time, and the vertical axis represents the logic levels, from top to bottom, of the signals $V1_{HV}$, $V2_{LV}$, $V1_{LV}$, and $V2_{HV}$.

As previously discussed, there may be some timing degradation in the first and second signals $V1_{HV}$ and $V2_{LV}$ when, for example, generated by the voltage domain splitter 210 based on the input signal $VIN_{PX}$. As an example, the second signal $V2_{LV}$ may have a pulse width or duty cycle greater that the pulse width or duty cycle of the first voltage signal $V1_{HV}$. For instance, in this particular example, the pulse width of the second signal $V2_{LV}$ extends from time $t_1$ to time $t_8$, and the pulse width of the first signal $V1_{HV}$ extends from $t_2$ to time $t_8$, where $t_8-t_1$ is greater than $t_5-t_2$. Further, in accordance with this example, the complementary first and second signals $\overline{V1_{HV}}$ and $\overline{V2_{LV}}$ are substantially the inverted versions of the first and second signals $V1_{HV}$ and $V2_{LV}$, respectively.

With further reference to FIG. 3, considering the operation of the edge alignment circuit 300, at time $t_1$, the second signal $V2_{LV}$ transitions from a low logic level to a high logic level in the LV domain. Substantially simultaneously, the complementary second signal $\overline{V2_{LV}}$ transitions from a high logic level to a low logic level in the LV domain. As the complementary second signal $\overline{V2_{LV}}$ is applied to the gate of the inverter 310, the PMOS FET M2 turns on and the NMOS FET M3 turns off. Then, at time $t_2$, the first signal $V1_{HV}$ transitions from a low logic level to a high logic level in the HV domain. As the first signal $V1_{HV}$ is applied to the gate of NMOS FET M1, the NMOS FET M1 turns on. As both FETs M1 and M2 are turned on, and FET M3 is turned off, the output signal $V1_{LV}$ transitions from a low logic level to a high logic level in the LV domain at time $t_3$, as the supply voltage provided to the upper voltage rail VDDIX is substantially the same as the high logic level in the LV domain, as previously discussed.

Then, at time $t_4$, the first signal $V1_{HV}$ transitions from a high logic signal to a low logic signal in the HV domain. As the first signal $V1_{HV}$ is applied to the gate of the NMOS FET M1, the FET M1 turns off. Then, at time $t_6$, the second signal $V2_{LV}$ transitions from a high logic level to a low logic level in the LV domain. Substantially simultaneously, the complementary second signal $\overline{V2_{LV}}$ transitions from a low logic level to a high logic level in the LV domain. As the complementary second signal $\overline{V2_{LV}}$ is applied to the input of the inverter 310, the PMOS FET M2 turns off and the NMOS FET M3 turns on. As both FETs M1 and M2 are turned off, and FET M3 is turned on, the output signal $V1_{LV}$ transitions from a high logic level to a low logic level in the LV domain at time $t_7$, as the supply voltage provided to the lower voltage rail VSSX is substantially the same as the low logic level in the LV domain, as previously discussed.

With further reference to FIG. 4, considering the operation of the edge alignment circuit 400, similarly at time $t_1$, the second signal $V2_{LV}$ transitions from a low logic level to a high logic level in the LV domain. As the second signal $V2_{LV}$ is applied to the gate of PMOS FET M6, the PMOS FET M6 turns off. Then, at time $t_2$, the first signal $V1_{HV}$ transitions from a low logic level to a high logic level in the HV domain. Substantially simultaneously, the complementary first signal $\overline{V1_{HV}}$ transitions from a high logic level to a low logic level in the HV domain. As the complementary first signal $\overline{V1_{HV}}$ is applied to the input of the inverter 410, the PMOS FET M4 turns on and the NMOS FET M5 turns off. As both FETs M5 and M6 are turned off, and FET M4 is turned on, the output signal $V2_{HV}$ transitions from a low logic level to a high logic level in the HV domain at time $t_3$, as the supply voltage provided to the upper voltage rail VDDPX is substantially the same as the high logic level in the HV domain, as previously discussed.

Then, at time $t_4$, the first signal $V1_{HV}$ transitions from a high logic level to a low logic level in the HV domain. Substantially simultaneously, the complementary first signal $\overline{V1_{HV}}$ transitions from a low logic level to a high logic level in the HV domain. As the complementary first signal $\overline{V1_{HV}}$ is applied to the input of the inverter 410, the PMOS FET M4 turns off and the NMOS FET M5 turns on. Then, at time $t_6$, the second signal $V2_{LV}$ transitions from a high logic level to a low logic level in the LV domain. As both FETs M5 and M6 are turned on, and FET M4 is turned off, the output signal $V2_{HV}$ transitions from a high logic level to a low logic level in the HV domain at time $t_7$, as the supply voltage provided to the lower voltage rail VSSIX is substantially the same as the low logic level in the HV domain, as previously discussed.

Note that the output signals $V1_{LV}$ and $V2_{HV}$ of the edge alignment circuits 300 and 400 have substantially time aligned rising edges at time $t_3$ and falling edges at time $t_7$. This is because the rising edge of the output signals $V1_{LV}$ and $V2_{HV}$ occurs in response to the rising edge of the first signal $V1_{HV}$, and the falling edge of the output signals $V1_{LV}$ and $V2_{HV}$ occur in response to the falling edge of the second signal $V2_{LV}$. Thus, the edge alignment circuit 300 and 400 may be used as a voltage level shifter for the input signals at the gates of FETs M1 and M6, respectively. In the case of edge alignment circuit 300, it operates as a downwards voltage level shifter to level shift the first signal $V1_{HV}$ from the HV voltage domain to the LV voltage domain In the case of edge alignment circuit 400, it operates as an upwards voltage level shifter to level shift the second signal $V2_{LV}$ from the LV voltage domain to the HV voltage domain.

Additional advantages of the edge alignment circuits 300 and 400 follow from the fact that they include a small number of devices. For example, without the optional latches 320 and 420, each of the edge alignment circuits 300 and 400 includes three (3) devices, compared to at least 18 devices for an example voltage level shifter, as previously discussed. With the optional latches 320 and 420, each of the edge alignment circuits 300 and 400 may have nine (9) devices, as each latch may include cross-coupled inverters. Additionally, due to the small number of devices, each of the edge alignment circuits 300 and 400 may occupy a relatively small IC footprint. Further, the delay associated with each of the edge alignment circuits 300 and 400 may be on the order of picoseconds (ps), whereas the delay associated with an example voltage level shifter may be on the order of nanoseconds (ns), as previously discussed.

Figure 6:
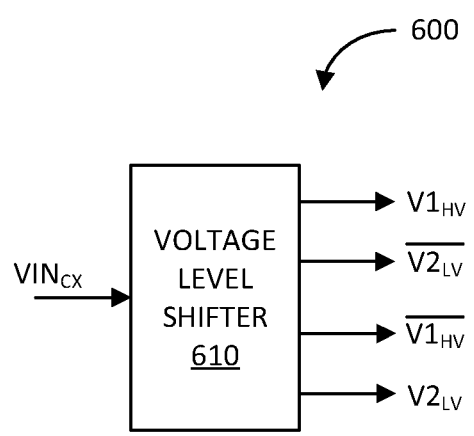
FIG. 6 illustrates a block diagram of another example signal processing system in accordance with another aspect of the disclosure.

FIG. 6 illustrates a block diagram of another example signal processing system 600 in accordance with another aspect of the disclosure. In the signal processing system 200, a voltage domain splitter 210 is used to generate signals in an upper half voltage domain HV and a lower half voltage domain LV from an input signal $VIN_{PX}$ in a PX voltage domain, which extends from the low logic voltage of the LV voltage domain to the high logic voltage of the HV voltage domain.

In signal processing system 600, an input signal $VIN_{CX}$ in a CX voltage domain (e.g., a voltage domain (e.g., 0.5V to 1.1V) used by high-speed signal processing circuits in an IC or SOC) is provided to a voltage level shifter 610. In this case, the voltage level shifter 610 generates a first signal $V1_{HV}$ and a complementary first signal $\overline{V1_{HV}}$ in the HV voltage domain (e.g., 0.9V to 1.8V) based on the input signal $VIN_{CX}$. Additionally, the voltage level shifter 610 generates a second signal $V2_{LV}$ and a complementary second signal $\overline{V2_{LV}}$ in the LV voltage domain (e.g., 0V to 0.9V) based on the input signal $VIN_{CX}$. However, due to different data paths, the first and second signals $V1_{HV}$ and $V2_{LV}$ and their respective complementary signals $\overline{V1_{HV}}$ and $\overline{V2_{LV}}$ may have timing degradation, as previously discussed.

Figure 7:
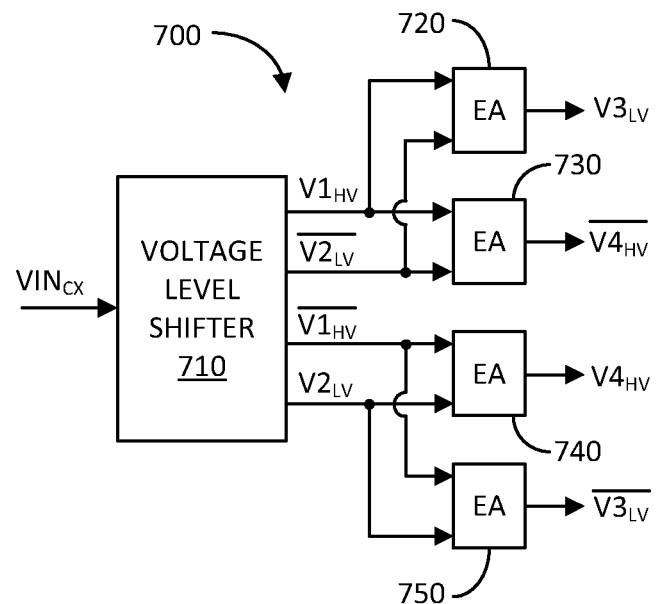
FIG. 7 illustrates a block diagram of another example signal processing system in accordance with another aspect of the disclosure.

FIG. 7 illustrates a block diagram of another example signal processing system 700 in accordance with another aspect of the disclosure. To address the timing degradation discussed with respect to signal processing system 600, the signal processing system 700 includes edge alignment circuits to retime or substantially time-align the signals for further processing by HV and LV voltage domain signal processing circuits, as previously discussed.

In particular, the signal processing system 700 includes a voltage level shifter 710 configured to receive an input signal $VIN_{CX}$ in the CX voltage domain (e.g., 0.5V to 1.1V), and generate a first signal $V1_{HV}$ and a complementary first signal $\overline{V1_{HV}}$ in the HV voltage domain (e.g., 0.9V to 1.8V), and a second signal $V2_{LV}$ and a complementary second signal $\overline{V2_{LV}}$ in the LV voltage domain (e.g., 0V to 0.9V); both sets of signals being based on the input signal $VIN_{CX}$.

The signal processing system 700 further includes a set of edge alignment circuits 720, 730, 740, and 740. The edge alignment circuit 720 is configured to receive the first signal $V1_{HV}$ and the complementary second signal $\overline{V2_{LV}}$, and generate a third signal $V3_{LV}$ in the LV domain. The edge alignment circuit 720 may be implemented per edge alignment circuit 300. The edge alignment circuit 730 is configured to receive the first signal $V1_{HV}$ and the complementary second signal $\overline{V2_{LV}}$, and generate a complementary fourth signal $\overline{V4_{LV}}$ in the HV domain. The edge alignment circuit 730 may be implemented per edge alignment circuit 400.

The edge alignment circuit 740 is configured to receive the complementary first signal $\overline{V1_{HV}}$ and the second signal $V2_{LV}$, and generate a fourth signal $V4_{HV}$ in the HV domain. The edge alignment circuit 740 may be implemented per edge alignment circuit 400. The edge alignment circuit 750 is configured to receive the complementary first signal $\overline{V1_{HV}}$ and the second signal $V2_{LV}$, and generate a complementary third signal $\overline{V3_{LV}}$ in the LV domain. The edge alignment circuit 750 may be implemented per edge alignment circuit 300. As these signals $V3_{LV}$, $\overline{V4_{HV}}$, $V4_{HV}$, and $\overline{V3_{LV}}$ are generated by edge alignment circuits 720, 730, 740, and 750, respectively, the rising and falling edges of the signals may be substantially time-aligned for improved processing by LV and HV voltage domain signal processing circuits.

Figure 8:
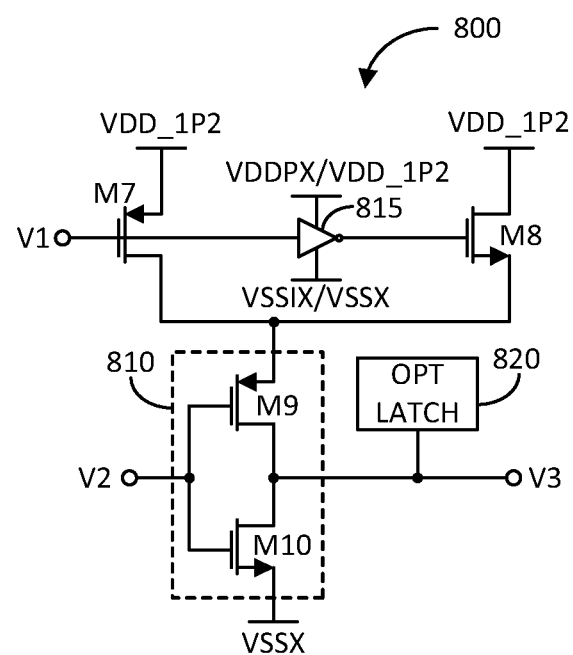
FIG. 8 illustrates a schematic diagram of an example multi-mode edge alignment circuit in accordance with another aspect of the disclosure.

FIG. 8 illustrates a schematic diagram of an example multi-mode edge alignment circuit 800 in accordance with another aspect of the disclosure. In a first mode of operation, the edge alignment circuit 800 operates per edge alignment circuit 300 previously discussed. In a second mode of operation, the edge alignment circuit 300 operates as a two-input inverter.

In particular, the edge alignment circuit 800 includes a first FET M7, which may be implemented as a PMOS FET. The edge alignment circuit 800 further includes a first inverter 815 including an input coupled to a gate of the PMOS FET M7. The first inverter 815 may be coupled to first and second programmable voltage rails VDDPX/VDD_1P2 and VSSIX/VSSX configured to receive supply voltages in accordance with an HV voltage domain (e.g., 1.8V and 0.9V, respectively) in the first mode of operation, and supply voltages in the VDD_1P2 voltage domain (e.g., 1.2V and 0V, respectively) in the second mode of operation.

The edge alignment circuit 800 additionally includes a second FET M8, which may be implemented as an NMOS FET. The edge alignment circuit 800 also includes a second inverter 810 including a third FET M9 and a fourth FET M10. The third FET M9 may be implemented as a PMOS FET, and the fourth FET M10 may be implemented as an NMOS FET. The second FET M8 and the second inverter 810 are coupled in series between an upper voltage rail VDD_1P2 and a lower voltage rail VSSX, which are configured to receive supply voltages in accordance with the VDD_1P2 voltage domain (e.g., 1.2V and 0V, respectively). The PMOS FET M7 is coupled between the upper voltage rail VDD_1P2 and the second inverter 810.

The PMOS FET M7 includes a gate configured to receive a first input signal V1. In accordance with the first mode of operation, the first input signal V1 varies in accordance with the HV voltage domain (e.g., 0.9V to 1.8V). In accordance with the second mode of operation, the first input signal V1 varies in accordance with the VDD_1P2 voltage domain (e.g., 0V to 1.2V). The PMOS FET M9 and the NMOS FET M10 include respective gates coupled together to form an input of the inverter 810, and configured to receive a second input signal V2. In accordance with the first mode of operation, the second input signal V2 varies in accordance with the LV voltage domain (e.g., 0V to 0.9V). In accordance with the second mode of operation, the second input signal V2 varies in accordance with the VDD_1P2 voltage domain (e.g., 0V to 1.2V).

The PMOS FET M9 and the NMOS FET M10 include respective drains coupled together to form an output of the inverter 810, and configured to generate an output signal V3. In the first mode of operation, the output signal V3 varies in accordance with the LV voltage domain (e.g., 0V to 0.9V). In the second mode of operation, the output signal V3 varies in accordance with the VDD_1P2 voltage domain (e.g., 0V to 1.2V). The edge alignment circuit 800 may optionally include a latch 820 coupled to the output of the inverter 810 to latch the output signal V3. This may improve the latching of the correct logic state of the output signal V3 if there is significant time delay between the first signal V1 and the second signal V2.

The mode of operation is set by the voltage domain of the first and second input signals V1 and V2. For instance, if the first and second input signals V1 and V2 vary in accordance with the HV and LV voltage domains, respectively, the edge alignment circuit 800 operates in accordance with the first mode of operation. In this mode, the PMOS FET M7 is effectively disabled, and the inverter 815 and the NMOS FET M8 are enabled. The inverter 815 generates the complementary first voltage V1 at the gate of NMOS FET M8, which, in this example, is substantially complementary to the logic level of the second voltage V2. As such, the operation of the edge alignment circuit 800 is effectively the same as the operation of the edge alignment circuit 300 previously discussed.

As discussed, in accordance with the first mode of operation, the PMOS FET M7 is effectively disabled because the first signal V1 is unable to turn on the PMOS FET M7 with the low logic level (e.g., 0.9V) in accordance with the HV voltage domain. If, for example, the threshold voltage of the PMOS FET M7 is 0.4V, the low logic level of 0.9V produces a gate-to-source voltage of 0.3V, which is less than the threshold voltage of 0.4V. As such, the PMOS FET M7 does not turn on.

If the first and second input signals V1 and V2 vary in accordance with the VDD_1P2 voltage domain, the edge alignment circuit 800 operates in accordance with the second mode of operation. In this mode, the PMOS FET M7, the inverter 815 and the NMOS FET M8 are enabled. As such, the edge alignment circuit 800 operates as a two-input inverter. That is, when the first and second input signals V1 and V2 are at a low logic level in accordance with the VDD_1P2 voltage domain (e.g., 0V), FETs M7, M8, and M9 turn on, and FET M10 turns off. Thus, the output signal V3 is at a high logic level (e.g., 1.2V) in accordance with the VDD_1P2 voltage domain. Conversely, when the first and second input signals V1 and V2 are at a high logic level in accordance with the VDD_1P2 voltage domain (e.g., 1.2V), FETs M7, M8, and M9 turn off, and FET M10 turns on. Thus, the output signal V3 is at a low logic level (e.g., 0V) in accordance with the VDD_1P2 voltage domain.

Figure 9:
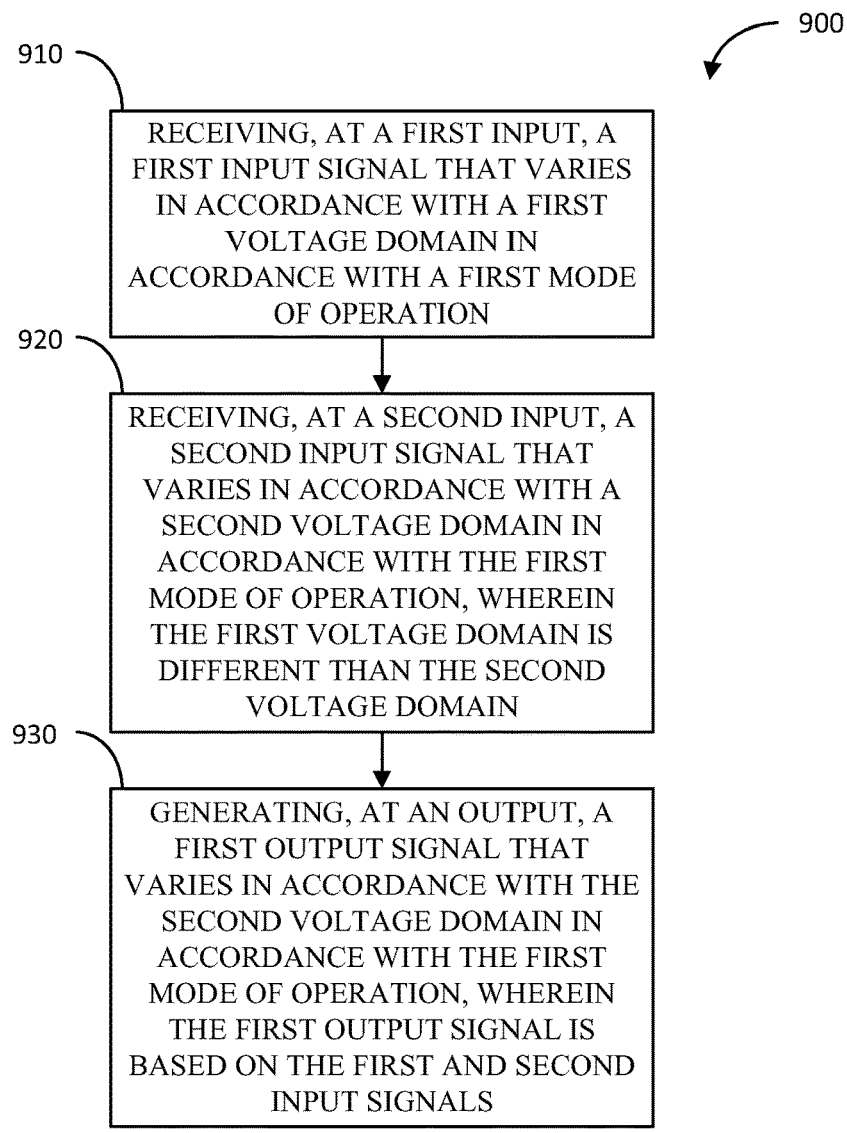
FIG. 9 illustrates a flow diagram of an example method of voltage level shifting an input signal to generate an output signal in accordance with another aspect of the disclosure.

FIG. 9 illustrates a flow diagram of an example method 900 of voltage level shifting an input signal to generate an output signal in accordance with another aspect of the disclosure.

The method 900 includes receiving, at a first input, a first input signal that varies in accordance with a first voltage domain in accordance with a first mode of operation (block 910). Examples of means for receiving, at a first input, a first input signal that varies in accordance with a first voltage domain in accordance with a first mode of operation include the gate of FET M1 in edge alignment circuit 300, the gate of FET M6 in edge alignment circuit 400, and the gate of FET M8 of edge alignment circuit 800, as well as respective first inputs of edge alignment circuits 215, 240, 720, 730, 740, and 735.

The method 900 further includes receiving, at a second input, a second input signal that varies in accordance with a second voltage domain in accordance with the first mode of operation, wherein the first voltage domain is different than the second voltage domain (block 920). Examples of means for receiving, at a second input, a second input signal that varies in accordance with a second voltage domain in accordance with the first mode of operation, wherein the first voltage domain is different than the second voltage domain include the input to inverter 310 in edge alignment circuit 300, the input to inverter 410 in edge alignment circuit 400, and the input to the inverter 810 of edge alignment circuit 800, as well as respective second inputs of edge alignment circuits 215, 240, 720, 730, 740, and 735.

Additionally, the method 900 includes generating, at an output, a first output signal that varies in accordance with the second voltage domain in accordance with the first mode of operation, wherein the first output signal is based on the first and second input signals (block 930). Examples of means for generating, at an output, a first output signal that varies in accordance with the second voltage domain in accordance with the first mode of operation, wherein the first output signal is based on the first and second input signals include inverter 310 of edge alignment circuit 300, inverter 410 of edge alignment circuit 400, and inverter 810 of edge alignment circuit 800, as well as the edge alignment circuits 215, 240, 720, 730, 740, and 735.

Figure 10:
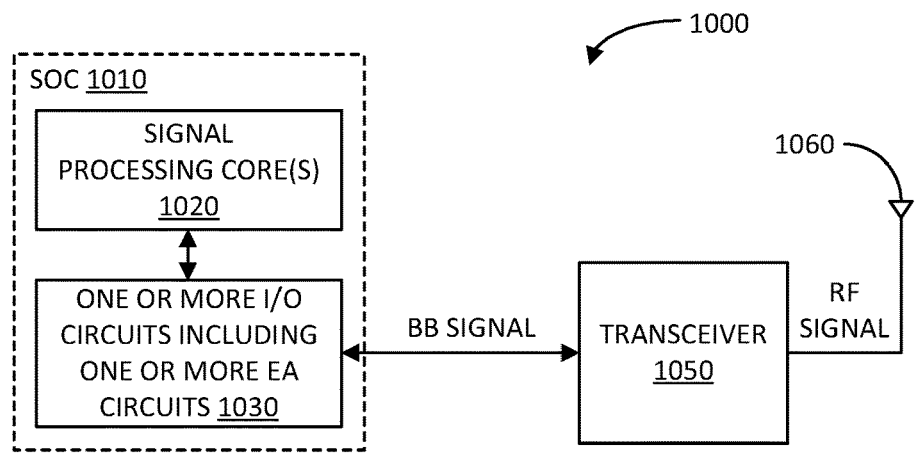
FIG. 10 illustrates a block diagram of an example wireless communication device in accordance with another aspect of the disclosure.

FIG. 10 illustrates a block diagram of an example wireless communication device 1000 in accordance with another aspect of the disclosure. The wireless communication device 1000 includes at least one antenna 1060 (e.g., an antenna array), a transceiver 1050 coupled to the at least one antenna 1060, and an integrated circuit (IC) or system on chip (SOC) 1010. The IC or SOC 1010, in turn, includes one or more signal processing cores 1020, and one or more input/output (I/O) drivers or circuits 1030 coupled to the transceiver. The one or more I/O circuits 1030 may include one or more edge alignment circuits implemented as previously discussed herein.

Pursuant to a signal transmission application, the one or more signal processing cores 1020 may be configured to process a transmit baseband (BB) signal in a first voltage domain (e.g., a CX voltage domain). The one or more I/O circuits 1030 may be configured to upwards voltage level shift the transmit (BB) baseband signal to a second voltage domain (e.g., a PX voltage domain). The one or more I/O circuits 1030 may include one or more edge alignment circuits, for example, each implemented per edge alignment circuit 400 to perform the upwards voltage level shifting. The transmit baseband (BB) signal in the second voltage domain is provided to the transceiver 1050, which is configured to generate a transmit radio frequency (RF) signal based on the transmit baseband (BB) signal. The transmit RF signal is provided to the at least one antenna 1060 for wireless transmission to one or more remote wireless devices.

Pursuant to a signal reception application, the at least one antenna 1060 is configured to wirelessly receive a received RF signal from one or more remote wireless devices. The transceiver 1050 is configured to generate a received baseband (BB) signal in the second voltage domain based on the received RF signal. The one or more I/O circuits 1030 is configured to downwards voltage level shift the received baseband (BB) signal to generate the received baseband (BB) signal in the first voltage domain. The one or more I/O circuits 1030 may include one or more edge alignment circuits, for example, each implemented per edge alignment circuit 300 or 800 to perform the downwards voltage level shifting. The one or more signal processing cores 1020 may be configured to process the received baseband (BB) signal in the first voltage domain.

The following provides an overview of aspects of the present disclosure:

Aspect 1: An apparatus including a first field effect transistor (FET) including a first gate configured to receive a first input signal that varies in accordance with a first voltage domain; and a first inverter including a first input configured to receive a second input signal that varies in accordance with a second voltage domain, and a first output configured to generate a first output signal that varies in accordance with the second voltage domain, wherein the first output signal is based on the first and second input signals, and wherein the first FET and the first inverter are coupled in series between first and second voltage rails.

Aspect 2: The apparatus of aspect 1, wherein the first and second voltage rails are configured to receive first and second supply voltages in accordance with the second voltage domain, respectively.

Aspect 3: The apparatus of aspect 1 or 2, wherein the first FET includes an n-channel metal oxide semiconductor (NMOS) FET.

Aspect 4: The apparatus of aspect 3, wherein the NMOS FET and the first inverter are coupled in series in that order between the first voltage rail and the second voltage rail.

Aspect 5: The apparatus of any one of aspects 1-4, wherein the second input signal varies between a first low logic voltage and a first high logic voltage in accordance with the second voltage domain, wherein the first supply voltage is substantially the same as the first high logic voltage, and wherein the second supply voltage is substantially the same as the first low logic voltage.

Aspect 6: The apparatus of aspect 5, wherein the first input signal varies between a second low logic voltage and a second high logic voltage in accordance with the first voltage domain, wherein the second low logic voltage is substantially the same as the first high logic voltage.

Aspect 7: The apparatus of aspect 1 or 2, wherein the first FET includes a p-channel metal oxide semiconductor (PMOS) FET.

Aspect 8: The apparatus of aspect 7, wherein the first inverter and the PMOS FET are coupled in series in that order between the first voltage rail and the second voltage rail.

Aspect 9: The apparatus of aspect 7 or 8, wherein the second input signal varies between a first low logic voltage and a first high logic voltage in accordance with the second voltage domain, wherein the first supply voltage is substantially the same as the first high logic voltage, and wherein the second supply voltage is substantially the same as the first low logic voltage.

Aspect 10: The apparatus of aspect 9, wherein the first input signal varies between a second low logic voltage and a second high logic voltage in accordance with the first voltage domain, wherein the second high logic voltage is substantially the same as the first low logic voltage.

Aspect 11: The apparatus of any one of aspects 1-10, wherein the first input signal is logically complementary to the second input signal.

Aspect 12: The apparatus of any one of aspects 1-11, further including a latch coupled to the first output of the first inverter.

Aspect 13: The apparatus of aspect 1, wherein the first gate of the first FET is configured to receive the first input signal, and the first inverter is configured to receive the second input signal and generate the first output signal in accordance with a first mode of operation.

Aspect 14: The apparatus of aspect 13, wherein the first and second voltage rails are configured to receive first and second supply voltages in accordance with a third voltage domain, respectively.

Aspect 15: The apparatus of aspect 13 or 14, further including: a second FET including a second gate configured to receive the first input signal in accordance with the first mode of operation, and a third input signal in accordance with the second mode of operation; and a second inverter including a second input coupled to the second gate of the second FET, and a second output coupled to first gate of the first FET.

Aspect 16: The apparatus of aspect 15, wherein the second inverter is coupled to programmable third and fourth voltage rails configured to receive third and fourth supply voltages in accordance with the first voltage domain and the first mode of operation, and receive the first and second supply voltages in accordance with the second mode of operation.

Aspect 17: The apparatus of aspect 15 or 16, wherein the first FET includes an n-channel metal oxide semiconductor (NMOS) FET, and wherein the second FET includes a p-channel metal oxide semiconductor (PMOS) FET.

Aspect 18: The apparatus of any one of aspects 15-17, wherein the second FET is coupled between the first voltage rail and the first inverter.

Aspect 19: The apparatus of any one of aspect 15-18, in accordance with the second mode of operation, the second gate of the second FET is configured to receive a third input signal that varies in accordance with the third voltage domain, and the first inverter is configured to receive a fourth input signal that varies in accordance with the third voltage domain and generate a second output signal that varies in accordance with the third voltage domain.

Aspect 20: The apparatus of any one of aspects 15-19, wherein: the second FET is effectively disabled, and the second inverter and the first FET are enabled in accordance with the first mode of operation; and the second FET, the second inverter and the first FET are enabled in accordance with the second mode of operation.

Aspect 21: A method, including: receiving a first input signal that varies in accordance with a first voltage domain in accordance with a first mode of operation; receiving a second input signal that varies in accordance with a second voltage domain in accordance with the first mode of operation, wherein the first voltage domain is different than the second voltage domain; and generating a first output signal that varies in accordance with the second voltage domain in accordance with the first mode of operation, wherein the first output signal is based on the first and second input signals.

Aspect 22: The method of aspect 21, wherein the first input signal is logically complementary to the second input signal.

Aspect 23: The method of aspect 21 or 22, wherein the first input signal varies between a first low logic voltage and a first high logic voltage in accordance with the first voltage domain, wherein the second input signal varies between a second low logic voltage and second high logic voltage in accordance with the second voltage domain, and wherein the second high logic voltage is substantially the same as the first low logic voltage.

Aspect 24: The method of aspect 21 or 22, wherein the first input signal varies between a first low logic voltage and a first high logic voltage in accordance with the first voltage domain, wherein the second input signal varies between a second low logic voltage and second high logic voltage in accordance with the second voltage domain, and wherein the first high logic voltage is substantially the same as the second low logic voltage.

Aspect 25: The method of any one of aspects 21-23, further including: receiving, at the first input, a third input signal that varies in accordance with a third voltage domain in accordance with a second mode of operation; receiving, at the second input, a fourth input signal that varies in accordance with the third voltage domain in accordance with the second mode of operation; and generating, at the output, a second output signal that varies in accordance with the third voltage domain in accordance with the second mode of operation, wherein the second output signal is based on the third and fourth input signals.

Aspect 26: An apparatus, including: a voltage domain splitter including an input configured to receive a first signal in a first voltage domain, a first output configured to generate a second signal in a second voltage domain, and a second output configured to generate a third signal in a third voltage domain, wherein the second and third signals are based on the first signal; a first edge alignment circuit configured to generate a fourth signal in the third voltage domain based on the second signal and a complementary of the third signal; and a second edge alignment circuit configured to generate a fifth signal in the third voltage domain based on a complementary of the second signal and the third signal.

Aspect 27: The apparatus of aspect 26, wherein the first edge alignment circuit includes: an n-channel metal oxide semiconductor field effect transistor (NMOS FET) including a gate configured to receive the second signal; and an inverter including an input configured to receive the complementary third signal, and an output configured to generate the fourth signal, wherein the NMOS FET and the inverter are coupled in series between first and second voltage rails associated with the third voltage domain.

Aspect 28: The apparatus of aspect 26 or 27, wherein the second edge alignment circuit includes: an inverter including an input configured to receive the complementary second signal, and an output configured to generate the fifth signal; and a p-channel metal oxide semiconductor field effect transistor (PMOS FET) including a gate configured to receive the third signal, wherein the inverter and the PMOS FET are coupled in series between first and second voltage rails associated with the second voltage domain.

Aspect 29: An apparatus, including: a voltage level shifter including an input configured to receive a first signal in a first voltage domain, a first output configured to generate a second signal in a second voltage domain, and a second output configured to generate a third signal in a third voltage domain, wherein the second and third signals are based on the first signal; a first edge alignment circuit configured to generate a fourth signal in the third voltage domain based on the second signal and a complementary of the third signal; and a second edge alignment circuit configured to generate a fifth signal in the third voltage domain based on a complementary of the second signal and the third signal.

Aspect 30: The apparatus of aspect 29, wherein at least one of the first or second edge alignment circuit, includes: a field effect transistor (FET) including a gate configured to receive the second or third signal; and an inverter including an input configured to receive the third or second signal, and an output configured to generate the fourth or fifth signal, wherein the FET and the inverter are coupled in series between first and second voltage rails.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
a first field effect transistor (FET) comprising an n-channel metal oxide semiconductor (NMOS) FET, including a first gate configured to receive a first input signal that varies in accordance with a first voltage domain; and
a first inverter including a first input configured to receive a second input signal that varies in accordance with a second voltage domain, and a first output configured to generate a first output signal that varies in accordance with the second voltage domain, wherein the first output signal is based on the first and second input signals, and wherein the first FET and the first inverter are coupled in series between first and second voltage rails,
wherein the first and second voltage rails are configured to receive first and second supply voltages in accordance with the second voltage domain, respectively, and further
wherein the NMOS FET and the first inverter are coupled in series in that order between the first voltage rail and the second voltage rail.
2. The apparatus of claim 1, wherein the second input signal varies between a first low logic voltage and a first high logic voltage in accordance with the second voltage domain, wherein the first supply voltage is substantially the same as the first high logic voltage, and wherein the second supply voltage is substantially the same as the first low logic voltage.

3. The apparatus of claim 2, wherein the first input signal varies between a second low logic voltage and a second high logic voltage in accordance with the first voltage domain, wherein the second low logic voltage is substantially the same as the first high logic voltage.

4. The apparatus of claim 1, wherein the first input signal is logically complementary to the second input signal.

5. The apparatus of claim 1, further comprising a latch coupled to the first output of the first inverter.

6. The apparatus of claim 1, wherein the first gate of the first FET is configured to receive the first input signal, and the first inverter is configured to receive the second input signal and generate the first output signal in accordance with a first mode of operation.

7. A method, comprising:
receiving, at a first input, a first input signal that varies in accordance with a first voltage domain in accordance with a first mode of operation;
receiving, at a second input, a second input signal that varies in accordance with a second voltage domain in accordance with the first mode of operation, wherein the first voltage domain is different than the second voltage domain;
generating, at an output, a first output signal that varies in accordance with the second voltage domain in accordance with the first mode of operation, wherein the first output signal is based on the first and second input signals;
receiving, at the first input, a third input signal that varies in accordance with a third voltage domain in accordance with a second mode of operation;
receiving, at the second input, a fourth input signal that varies in accordance with the third voltage domain in accordance with the second mode of operation; and
generating, at the output, a second output signal that varies in accordance with the third voltage domain in accordance with the second mode of operation, wherein the second output signal is based on the third and fourth input signals.

8. The method of claim 7, wherein the first input signal is logically complementary to the second input signal.

9. The method of claim 7, wherein the first input signal varies between a first low logic voltage and a first high logic voltage in accordance with the first voltage domain, wherein the second input signal varies between a second low logic voltage and second high logic voltage in accordance with the second voltage domain, and wherein the second high logic voltage is substantially the same as the first low logic voltage.

10. The method of claim 7, wherein the first input signal varies between a first low logic voltage and a first high logic voltage in accordance with the first voltage domain, wherein the second input signal varies between a second low logic voltage and second high logic voltage in accordance with the second voltage domain, and wherein the first high logic voltage is substantially the same as the second low logic voltage.

\* \* \* \* \*